United States Patent
Yang et al.

(10) Patent No.: US 6,200,884 B1
(45) Date of Patent: Mar. 13, 2001

(54) METHOD FOR SHAPING PHOTORESIST MASK TO IMPROVE HIGH ASPECT RATIO ION IMPLANTATION

(75) Inventors: Chih-Yuh Yang, San Jose; Mark S. Chang, Los Altos, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/364,976

(22) Filed: Jul. 31, 1999

(51) Int. Cl.⁷ .................................................. H01L 21/425
(52) U.S. Cl. .......................... 438/514; 438/519; 438/525; 438/527; 438/531; 257/404; 257/408; 430/311; 430/313; 430/314; 216/67; 216/79
(58) Field of Search ...................................... 438/514, 506, 438/450, 480, 164, 510, 525, 531; 430/311–319

(56) References Cited

U.S. PATENT DOCUMENTS

| | | | |
|---|---|---|---|
| 5,300,454 | * | 4/1994 | Taft et al. .................... 148/DIG. 106 |
| 5,371,024 | * | 12/1994 | Hieda et al. ........................... 438/270 |
| 5,488,001 | * | 1/1996 | Brotherton et al. .................. 438/164 |
| 5,910,453 | * | 6/1999 | Gupta et al. .......................... 438/724 |
| 5,955,764 | * | 9/1999 | Katsube ................................ 257/203 |
| 6,006,763 | * | 12/1999 | Mori et al. ............................ 134/1.2 |
| 6,025,208 | * | 2/2000 | Chui et al. ............................. 438/50 |
| 6,036,874 | * | 3/2000 | Farnaam ................................ 216/39 |
| 6,040,600 | * | 3/2000 | Uenishi et al. ....................... 257/335 |
| 6,074,568 | * | 6/2000 | Adachi et al. ........................ 438/14 |
| 6,077,742 | * | 6/2000 | Chen et al. ........................... 438/255 |
| 6,077,743 | * | 6/2000 | Chen et al. ........................... 438/255 |

OTHER PUBLICATIONS

Wolf and Tauber, Silicon Processing for the VLSI Era, vol. 1, p. 293, Lattice press (1986).*
Merriam–Webster's Collegiate Dictionary, Tenth Edition (1999).*

* cited by examiner

Primary Examiner—Charles Bowers
Assistant Examiner—Asok K. Sarkar
(74) Attorney, Agent, or Firm—Lariviere, Grubman & Payne, LLP

(57) ABSTRACT

A method for making a ULSI MOSFET chip includes masking areas such as transistor gates with photoresist mask regions. Prior to ion implantation, the top shoulders of the mask regions are etched away, to round off the shoulders. This promotes subsequent efficient quasi-vertical ion implantation, commonly referred to as "high aspect ratio implantation" in the semiconductor industry.

16 Claims, 1 Drawing Sheet

METHOD FOR SHAPING PHOTORESIST MASK TO IMPROVE HIGH ASPECT RATIO ION IMPLANTATION

TECHNICAL FIELD

The present invention relates generally to fabricating ultra-large scale integration (ULSI) semiconductor devices such as a ULSI metal oxide silicon field effect transistors (MOSFET), and more particularly to methods for improving the efficiency of high aspect ratio ion implantation in semiconductor fabrication.

BACKGROUND OF THE INVENTION

Semiconductor chips or wafers are used in many applications, including as processor chips for computers, and as integrated circuits and as flash memory for hand held computing devices, wireless telephones, and digital cameras. A common circuit component of semiconductor chips is the transistor. In ULSI semiconductor chips, a transistor is established by forming a polysilicon gate stack on a silicon substrate, and then forming a source region and a drain region in the substrate beneath the gate stack by implanting ion dopants into the areas of the substrate that are to become the source and drain regions. This generally-described structure cooperates to function as a transistor.

To shield the gate from the ions that are implanted to establish the source and drain regions, a photoresist mask is deposited over the areas sought to be shielded prior to ion implantation. Ions are then implanted in the areas between adjacent masked areas, often using what is referred to as "high aspect ratio" implantation in which the ions are directed almost vertically against the unshielded areas. High aspect ratio implantation is increasingly used mainly because the resist mask dimensions (i.e., a high aspect ratio space region) increasingly are smaller than they have been, to facilitate establishing more components on smaller chips. While for illustration purposes the above discussion considers ion implantation and photoresist gate masking in the transistor context, it is to be understood that the present invention is more widely directed to ion implantation in general.

It happens that the photoresist mask regions are formed with rectangular profiles. As understood herein, during ion implantation the top shoulders of the rectangular photoresist mask regions can block portions of the ion beam, particularly when a high aspect ratio is used to implant the ions. The present invention, having recognized the above-noted problem, provides the below-disclosed solutions, which also enhance device scaling in terms of process capability, since the present invention efficiently addresses any implantation process that requires high aspect ratio implantation.

BRIEF SUMMARY OF THE INVENTION

A method is disclosed for establishing an ion implantation region in a semiconductor substrate. The method includes forming plural mask regions over areas sought to be masked, and etching away top shoulders of the mask regions. Ions are then implanted at a high aspect ratio into areas between the mask regions.

In a preferred embodiment, the top shoulders, which initially are square, are etched away by directing plasma etchant against the mask regions to thereby round the shoulders. Non-reactive chemistry using Helium, Nitrogen, and/or Oxygen can be used to shape the shoulders, or reactive etch chemistry using Hydrogen Bromide with Oxygen ($HBr/O_2$), or Chlorine with Oxygen ($Cl_2/O_2$), can be used. The etching act can be undertaken in a reactive ion etch chamber or a high density plasma chamber. A semiconductor device made according to the method, as well as a digital processing apparatus incorporating the semiconductor device, are also disclosed.

In another aspect, a method for making an ultra-large scale integration (ULSI) semiconductor device includes masking, with at least one resist layer, areas sought to be protected from ion implantation. This masking forms the aforementioned high aspect ratio space region. The method further includes shaping at least one shoulder of the resist layer to promote efficient ion implantation, then implanting ions into unmasked areas.

Other features of the present invention are disclosed or apparent in the section entitled "DETAILED DESCRIPTION OF THE INVENTION".

DETAILED DESCRIPTION OF THE INVENTION

Figure 1:
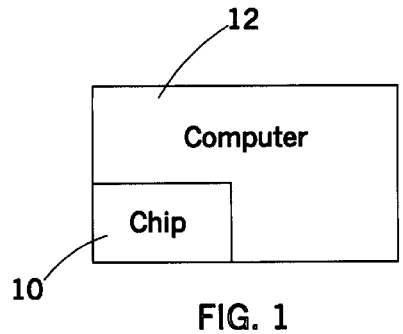
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
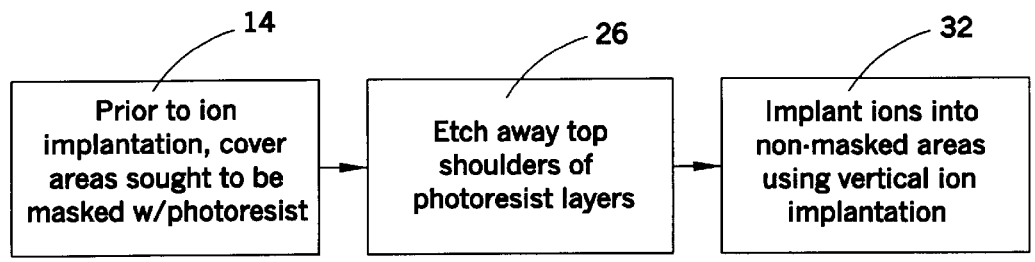
FIG. 2 is a flow chart showing the steps of the present invention.
Figures 3, 4, 5:
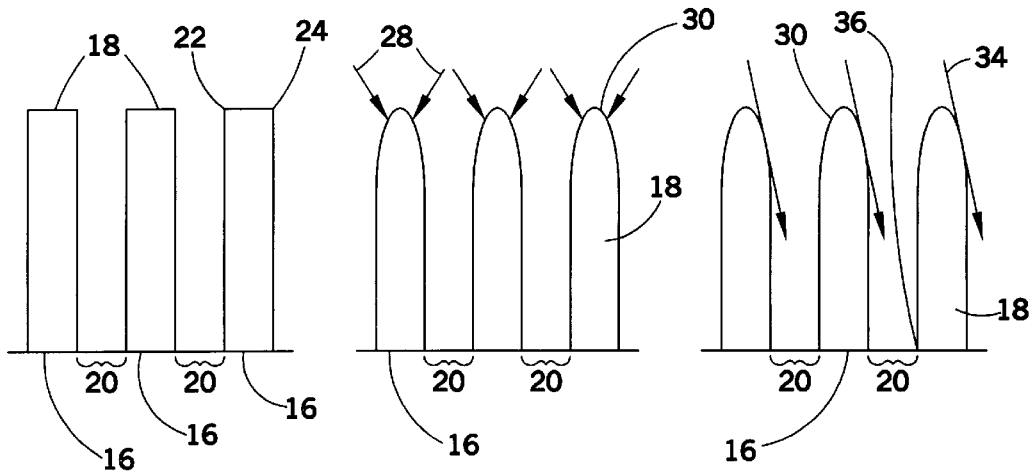
FIG. 3 is a side view showing the photoresist mask regions prior to etching.
FIG. 4 is a side view showing the photoresist mask regions after etching.
FIG. 5 is a side view showing the photoresist mask regions after etching, during subsequent high aspect ratio ion implantation.

Now referring to FIGS. 2 and 3, as indicated at block 14 in FIG. 2 and as shown in FIG. 3, prior to ion implantation areas 16 sought to be masked from ion implantation are covered with respective photoresist mask regions 18 in accordance with photoresist deposition processes known in the art. The areas 16 sought to be masked can be, e.g., transistor gates. Implantation regions 20, which can be portions of a semiconductor substrate, are established between adjacent areas 16 sought to be masked. After ion implantation, the implantation regions 20 can establish, e.g., transistor source and drain regions. It is to be understood, however, that the present principles apply to masking selected areas from high aspect ratio ion implantation in general.

As shown in FIG. 3, the mask regions 1.8 are rectangular in cross-section, with each mask region 18 defining square left and right top shoulders 22, 24. It is the object of the present invention to alter the top shoulders 22, 24 of the mask regions 18 to facilitate high aspect ratio ion implantation.

Accordingly, proceeding to block 26 in FIG. 2, the top shoulders 22, 24 of the mask regions 18 are gently shaped, preferably by directing plasma etchant (represented by arrows 28 in FIG. 4) against the mask regions 18, to result in rounded top shoulders 30 for the mask regions 18. Preferably, the etchant 28 is directed against the mask regions 18 at a 45° angle relative to the vertical dimension in FIG. 4. Regardless of the angle at which it is directed against the mask regions 18, the shoulders 22, 24 of the mask regions 18 shown in FIG. 3 experience the highest etch rate.

Non-reactive chemistry using Helium, Nitrogen, and/or Oxygen can be implemented at block 26. In other words, the etchant 28 can be Helium (He), Nitrogen (N), Oxygen (0), or more preferably some combination thereof. Alternatively, a controllable reactive etch chemistry can be used. For example, the etchant 28 can be Hydrogen Bromide with Oxygen (HBr/$O_2$), or Chlorine with Oxygen ($Cl_2/O_2$), and the etching can be undertaken in either a reactive ion etch chamber or a high density plasma chamber.

After etching the mask regions 18 to shape them as described, the process moves to block 32 of FIG. 2, wherein ions (represented by arrows 34 in FIG. 5) are implanted into the implantation regions 20 preferably using the high aspect ratio shown, i.e., using ion beam angles that are close to vertical. It will be appreciated that by using high aspect ratios, corner areas 36 of the implantation regions 20 can be more efficiently implanted with ions, and that this efficiency is further enhanced by rounding off the shoulders of the mask regions 18 as described above to avoid blocking some ions from reaching the corner areas 36. With this invention, the implant mask profile is preserved without damaging the resist pattern and with the top shoulders being rounded off reliably and controllably, to promote efficient implantation. Although the critical dimension of the implant mask may be slightly affected, this is not unduly critical during implantation. If desired, loss of critical dimension can be compensated for by biasing the mask appropriately.

While the particular METHOD FOR SHAPING PHOTORESIST MASK TO IMPROVE HIGH ASPECT RATIO ION IMPLANTATION as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for".

What is claimed is:

1. A method for establishing an ion implantation region in a semiconductor substrate, comprising:

forming a plurality of mask regions over a plurality of areas on said semiconductor substrate, said forming step resulting in defining a plurality of implantation regions on said substrate as well as a plurality of space regions over said substrate, each of said plurality of space regions having a high aspect ratio cross-sectional area, said plurality of space regions being disposed over said plurality of implantation regions, each of said plurality of mask regions having a pair of top shoulders;

etching away said top shoulders of each of the plurality of mask regions; and implanting ions at a quasi-vertical angle across said high aspect ratio cross-sectional area and into said plurality of implantation regions, thereby improving source/drain ion implantation.

2. The method of claim 1, wherein the pair of top shoulders are etched away by directing at least one etchant against the pair of top shoulders of the mask regions.

3. The method of claim 2, wherein the pair of top shoulders are square before the etching act and are rounded after the etching step.

4. The method of claim 3, wherein the etching step is accomplished using non-reactive etch chemistry.

5. The method of claim 4, wherein the non-reactive etch chemistry comprises the use of at least one etchant selected from a group of etchants consisting essentially of Helium, Nitrogen, and Oxygen.

6. The method of claim 3, wherein the etching step is accomplished using reactive etch chemistry.

7. The method of claim 6, wherein the reactive etch chemistry comprises the use of at least one etchant selected from a group of etchants consisting essentially of a Hydrogen Bromide—Oxygen (Hbr/$O_2$) mixture and a Chlorine—Oxygen ($Cl_2/O_2$) mixture.

8. The method of claim 1, wherein the etching step is undertaken in a reaction chamber selected from a group of reaction chambers consisting essentially of a reactive ion etch chamber and a high density plasma chamber.

9. A method for making an ultra-large scale integration (ULSI) semiconductor device, comprising:

masking, with at least one resist layer, a plurality of areas on a semiconductor substrate, said masking step resulting in defining a plurality of implantation regions on said substrate as well as a plurality of space regions over said substrate, each of said at least one resist layer having a high aspect ratio cross-sectional area, said plurality of space regions being disposed over said plurality of implantation regions, each of said plurality of mask regions having a pair of top shoulders;

shaping at least one shoulder of the at least one resist layer to promote efficient ion implantation; and implanting ions into at a quasi-vertical angle across said high aspect ratio cross-sectional area and into said plurality of implantation regions, thereby improving source/drain ion implantation.

10. The method of claim 9, wherein the shaping step is accomplished by etching.

11. The method of claim 10, wherein the at least one shoulder is etched away by directing at least one etchant against the at least one shoulder of the resist layer.

12. The method of claim 11, wherein the at least one shoulder is square before the etching step and is rounded after the etching step.

13. The method of claim 12, wherein the etching step is accomplished using non-reactive etch chemistry.

14. The method of claim 13, wherein the non-reactive etch chemistry comprises the use of at least one etchant selected from a group of etchants consisting essentially of Helium, Nitrogen, and Oxygen.

15. The method of claim 12, wherein the etching step is accomplished using reactive etch chemistry.

16. The method of claim 15, wherein the reactive etch chemistry comprises the use of at least one etchant selected from a group of etchants consisting essentially of a Hydrogen Bromide—Oxygen (Hbr/$O_2$) mixture and Chlorine—Oxygen ($Cl_2/O_2$) mixture against the at least one shoulder of the resist layer.

* * * * *

UNITED STATES PATENT AND TRADEMARK OFFICE
CERTIFICATE OF CORRECTION

PATENT NO.    : 6,200,884 B1
DATED         : March 13, 2001
INVENTOR(S)   : Chih-Yuh Yang, Mark S. Chang It is certified that error appears in the above-identified patent and that said Letters Patent is hereby corrected as shown below:

Title page, item [54],
Column 1,
Delete [HIGH ASPECT RATIO] and replace with
-- VERTICAL --

Column 2,
Line 54, delete [1.8] and replace with -- 18 --

Signed and Sealed this

Sixteenth Day of October, 2001

Attest:

NICHOLAS P. GODICI
Attesting Officer   Acting Director of the United States Patent and Trademark Office